United States Patent [19]

Rice et al.

[11] Patent Number: 4,808,967
[45] Date of Patent: Feb. 28, 1989

[54] CIRCUIT BOARD MATERIAL

[75] Inventors: James M. Rice, Santa Monica; Bruce P. Mahler, Thousand Oaks, both of Calif.

[73] Assignee: Ohmega Electronics, Culver City, Calif.

[21] Appl. No.: 738,835

[22] Filed: May 29, 1985

[51] Int. Cl.⁴ ............................................. H01C 1/012
[52] U.S. Cl. .................................. 338/309; 338/308; 428/667
[58] Field of Search ............... 338/309, 306, 307, 308, 338/310; 204/40, 41, 44.7; 428/667, 672, 680

[56] References Cited

U.S. PATENT DOCUMENTS

| | | | |
|---|---|---|---|
| 2,643,221 | 6/1953 | Brenner et al. | 204/43 |
| 3,077,442 | 2/1963 | Koretzky | 204/37 |
| 3,743,583 | 7/1973 | Castonguay | 204/27 |
| 3,808,576 | 4/1974 | Castonguay et al. | 338/309 |
| 3,857,683 | 12/1974 | Castonguay | 204/44.7 |
| 4,554,219 | 11/1985 | Gamblin | 428/667 |

OTHER PUBLICATIONS

Abner Brenner, Electrodeposition of Alloys, vol. II, Academic Press, New York, 1963, pp. 457-461.
F. A. Lowenheim, Electroplating, McGraw-Hill Book Co., New York, 1978, pp. 389-400.
Max Hansen, Constitution of Binary Alloys, McGraw-Hill Book Co., New York, 1958, pp. 1027-1028.

Primary Examiner—E. A. Goldberg
Assistant Examiner—M. M. Lateef
Attorney, Agent, or Firm—Spensley Horn Jubas & Lubitz

[57] ABSTRACT

A multilayered circuit board material is disclosed. The material includes an insulating material support layer, an electrical resistance material layer adhering to the support layer, and a conductive material layer adhering to the resistance material layer and in intimate contact with that layer. The electrical resistance material layer is formed from electroplated nickel-phosphorous containing up to about 30% by weight of phosphorous; however, no appreciable amounts of sulfur are present within at least the top about ten atomic layers of the electrical resistance material layer. As a result, the stability of the electrical resistance material layer is significantly increased. In addition, the electroplating bath does not contain chloride salts resulting in decreased pitting in the electrical resistance material layer.

10 Claims, 3 Drawing Sheets

CIRCUIT BOARD MATERIAL

BACKGROUND OF INVENTION

1. Field of the Invention

This invention relates to the field of circuit board material manufacture, and in particular, to electroplated, multilayered printed circuit board materials

2. Prior Art

In U.S. Pat. No. 3,808,576, assigned to Ohmega Technologies, Inc., a multilayered printed circuit board material is disclosed containing an insulating material support layer having joined thereto an electrical resistance material layer which is in intimate contact with a conductive material layer. The electrical resistance material layer disclosed in that patent is electroplated nickel, and contains up to about 30 percent by weight of phosphorous. The electroplating bath for this layer as disclosed therein is a modification of the standard Watts bath wherein boric acid is replaced by mixtures of phosphorous acid and phosphoric acid. The plating bath also includes nickel sulfate and nickel chloride. Nickel sulfate and nickel chloride have been used in the plating industry for years as traditional nickel salts; with nickel sulfate being one of the most available and least expensive nickel salts and nickel chloride functioning as an anode corroder.

While use of the plating bath disclosed in the above referenced patent has produced a useful product, the resulting nickel-phosphorus electrical resistance material layer has several problems including excessive porosity and poor peel strength. In addition, it is desirable to enhance other electrical properties of the electrical resistance material layer.

SUMMARY OF THE INVENTION

The present invention relates to a printed circuit board material comprising a substrate layer, an electrical resistance material layer on the substrate, and a conductive material layer in intimate contact with the electrical resistance material layer. The electrical resistance material layer comprises electroplated nickel with up to 30 percent by weight of phosphorus; however, there is no sulfur in the top atomic layers of the electrical resistance material layer. Moreover, sulfate and chloride salts are not used in the plating bath. As a result, the circuit board material of the present invention shows significant improvement and stability, e.g., peel strength, resistance change after time, temperature coefficient of resistance, current noise and decreased pitting, compared with prior art circuit board materials. The improvements result from the electro deposition of the electrical resistance material layer from a plating bath substantially free of sulfate and chloride salts.

DESCRIPTION OF PREFERRED EMBODIMENTS

The following description is of the best presently contemplated mode of carrying out the invention. This description is made for the purpose of illustrating the general principles of the invention and is not to be taken in a limiting sense. The scope of the invention is best determined by reference to the appended claims.

Figure 5:
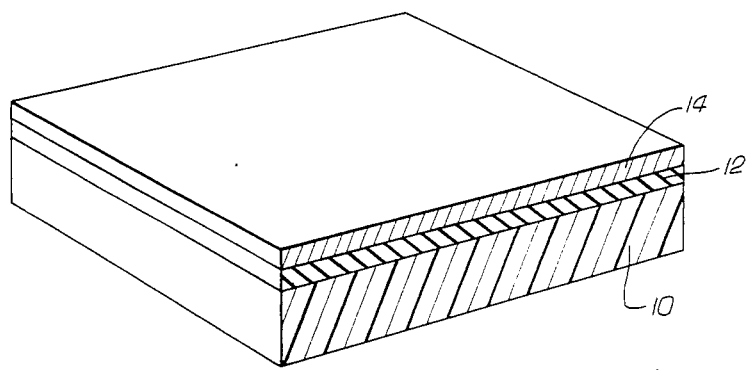
FIG. 5 illustrates the printed circuit board material of the present invention in the form of a multilayer stock material.

The present invention is directed to a multilayered printed circuit board material, illustrated in FIG. 5, and a method for producing that material. In general the circuit board (FIG. 5) has three layers, a substrate 10, an electrical re, material layer 12 and a conductive material layer 14. While three layers are typical, more than three layers are within the scope of the present invention.

The focus of the present invention is on improving the quality of the circuit board material, and in particular, the electrical resistance material layer. It has been found that by altering the constituents of the electrical resistance material layer plating bath significant improvements in the stability and porosity of the electrical resistance material layer are observed.

Figure 4:
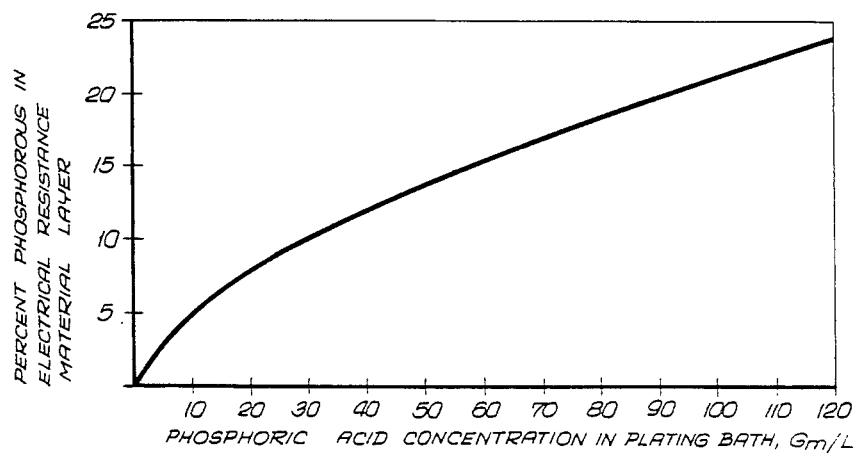
FIG. 4 is a graph of percent by weight phosphorus in the electrical resistance material layer of the present invention versus phosphoric acid concentration in the plating bath.

A. The Electrical Resistance Material Layer Plating Bath. The key to the improvements in the electrical resistance material layer of the present invention is the lack of sulfate salts, and preferably also chloride salts, in the plating bath. For example, a nickel-phosphorous resistance material layer having up to 30% phosphorous can be electroplated on a substrate using a bath comprising, and preferably consisting essentially of, the following exemplary constituents: nickel carbonate, phosphoric acid, and phosphorous acid. Unlike the plating baths disclosed in U.S. Pat. No. 3,808,576, the bath of the present invention does not include nickel sulfate and nickel chloride. The phosphoric acid and phosphorous acid content in the plating bath can be adjusted, or even reduced to zero, to provide from 0 to 30 percent by weight of phosphorous in the electrical resistance material layer. The more typical composition; however, is from 8 to 30 percent by weight of phosphorous. See FIG. 4 and the discussion below. As discussed further below, the lack of chloride salts and sulfate salts in the plating bath results in the circuit board material showing increased stability and decreased porosity.

B. The Process. After plating the nickel-phosphorous electrical resistance material layer on a conductive material substrate, e.g., copper foil, the electrical resistance material layer is given an oxidizing treatment such as that previously described in U.S. Pat. No. 3,808,576. Next, the conductive resistive material is laminated to an insulating substrate with the oxidized nickel surface of the resistive material in intimate contact with the insulating substrate.

Following lamination, the copper surface is coated with photoresist which is then exposed through a photographic negative containing the combined conductor and resistor patterns. The exposed photoresist is developed leaving the composite resistor-conductor pattern protected. The exposed copper is etched with a conventional etchant. The panel is rinsed in water and immersed in a selective etchant until the exposed resistor layer is removed. The remaining photoresist is stripped away and the panel is again coated with photoresist and exposed to protect the conductor pattern. The exposed photoresist is developed and the panel is etched in chromic acid until the bare copper is removed. The panel is rinsed, the remaining photoresist stripped away, again rinsed and dried. At this point, the conductive and resistive elements are defined and in electrical contact with each other.

C. The Electrical Resistance Material Layer Plating Bath Examples. The following examples are presented solely to illustrate the invention and should not be regarded as limiting in any way. The plating cell was the same in all of the following examples. Mild agitation was provided by a recirculating pump to maintain uniform bath temperature. The cathode was electrodeposited one ounce copper foil which was plated on the matte side. The shiny or drum side of the foil was masked by a rubber coated backing fixture. The cathode and fixture were in equilibrium with the bath temperature. The cathode size was 11.5 inch×14.25 inch. The anode was platinum clad columbium with an anode to cathode ratio of 1.3:1.

Example 1. (Reference Bath having the same components as that shown in U.S. Pat. No. 3,808,576 above, also see U.S. Pat. No. 2,643,221 to Brenner)

|  | g/l | M/L |
|---|---|---|
| $NiSO_4.6H_2O$ | 150 | 0.57 |
| $NiCl_2.6H_2O$ | 45 | 0.19 |
| $NiCO_3$ | 15 | 0.125 |
| $H_3PO_4$ | 49 | 0.50 |
| $H_3PO_3$ | 41 | 0.50 |
| Temperature | 75° C. | |
| Current | 50 Amperes | |
| Time | 30 Seconds | |
| $R_s$Ohms/square | 25 | |

Example 2. In this example nickel carbonate and phosphorous acid were reacted to form nickel acid phosphite:

$$NiCO_3 + 2H_3PO_3 = Ni(H_2PO_3)_2 + CO_2 + H_2O$$

|  | g/l | M/L |
|---|---|---|
| $NiCO_3$ | 106 | 1.0 |
| $H_3PO_3$ | 164 | 2.0 |
| Temperature | 70° C. | |
| Current | 50 Amperes | |
| Time | 30 Seconds | |
| $R_s$Ohms/square | 5 | |

Example 3. In this example, 0.25 M/L of phosphoric acid was added to the bath of Example 2.

|  | g/l | M/L |
|---|---|---|
| $NiCO_3$ | 106 | 1.0 |
| $H_3PO_3$ | 164 | 2.0 |
| $H_3PO_4$ | 25 | 0.25 |
| Temperature | 70° C. | |
| Current | 50 Amperes | |
| Time | 30 Seconds | |
| $R_s$Ohms/square | 15 | |

Example 4. In this example, the phosphoric acid was increased to 0.5 M/L.

|  | g/l | M/L |
|---|---|---|
| $NiCO_3$ | 106 | 1.0 |
| $H_3PO_3$ | 164 | 2.0 |
| $H_3PO_4$ | 50 | 0.5 |
| Temperature | 70° C. | |
| Current | 50 Amperes | |
| Time | 30 Seconds | |
| $R_s$Ohms/square | 50 | |

Example 5. In this example, the temperature of the bath was increased to that of Example 1. It should be appreciated that this bath, and also the baths of Examples 2-4, are substantially, if not entirely sulfate and chloride free, i.e., the only sulfate and chloride present being contaminents in the other constituents or in the water.

|  | g/l |
|---|---|
| $NiCO_3$ | 106 |
| $H_3PO_3$ | 164 |
| $H_3PO_4$ | 50 |
| Temperature | 75° C. |
| Current | 50 Amperes |
| Time | 30 Seconds |
| $R_s$Ohms/square | 25 |

D. The Unexpected Properties. Several unexpected phenomena were discovered which explains the significant improvement in the quality and resultant physical and electrical properties of the nickel-phosphorous electrical resistance material layer.

Figure 1:
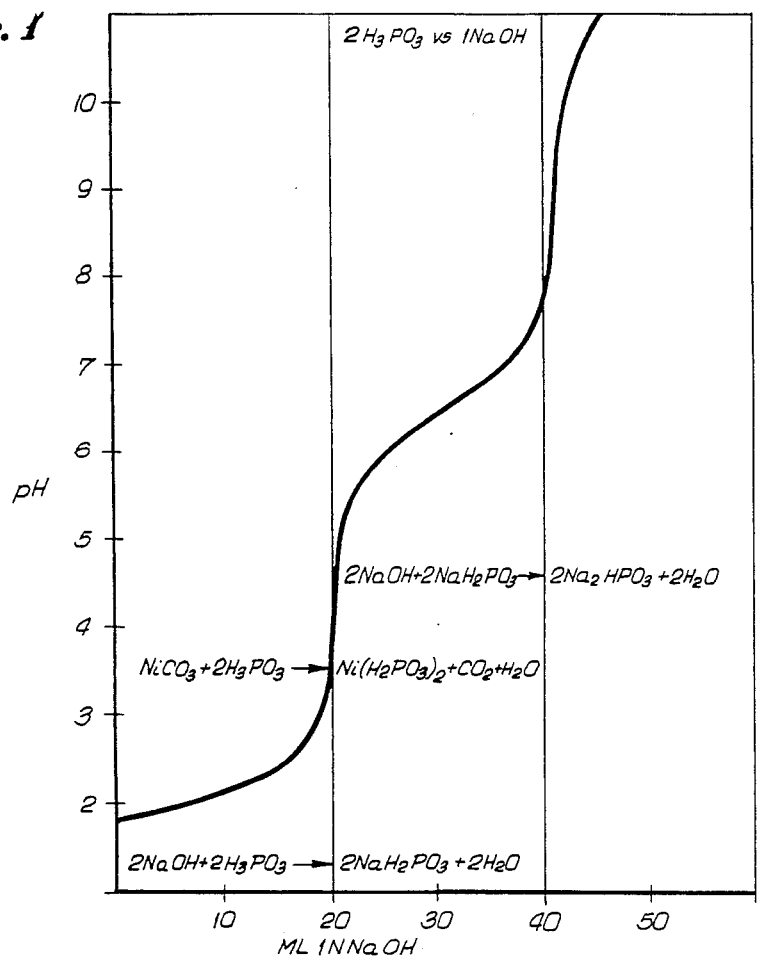
FIG. 1 is a titration curve.

First, the pH of the bath of Example 5 is about one pH unit higher than that of Example 1. This is consistent with the pH of phosphorous and phosphoric acids. The pH of Example 1 would suggest the formation of a ligand of nickel phosphite creating free hydrochloric acid. For example, if ⅛ mol of nickel carbonate reacted with ½ mol of phosphorous acid there would remain ¼ mol of unreacted phosphrous acid. See FIG. 1. Then, apparently, the nickel chloride reacts with the free phosphorous acid $$0.19NiCl_2 + 0.25H_3PO_3 = 0.125$$
$$Ni(H_2PO_3)_2 + 0.065NiCl_2 + 0.25HCl$$

The calculated pH of 0.25M HCl is log $$\frac{1}{2.5 \times 10 - 1} = \log \frac{10}{2.5}.$$

Figure 2:
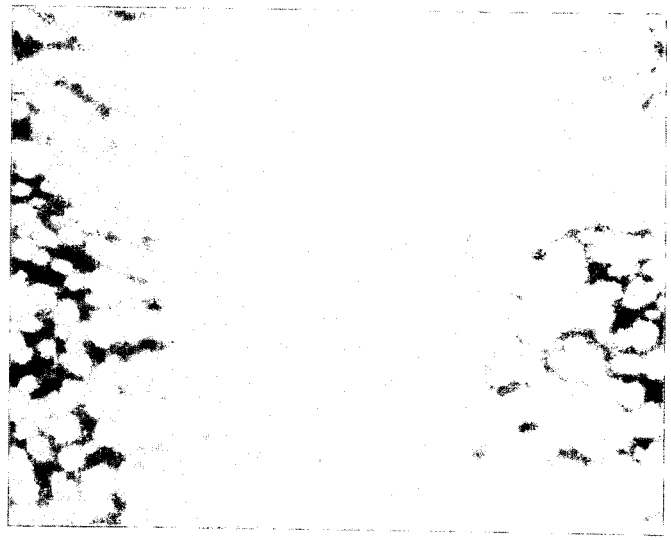
FIG. 2 is a photograph of the surface of an electrical resistance material layer prepared according to a prior art process.

The log of 2.5 is 0.398 or 0.4 and the pH is 1.0−0.4=0.6, which could explain the unusually low pH of the Reference Bath (Example 1) and the voids or pits as seen in the photograph (magnification 400×) of the surface of an electrical resistance material layer prepared according to the Reference Bath and shown in FIG. 2. Comparing FIG. 2 with the photograph shown in FIG. 3, which is a photograph (magnification 400×) of the surface of a resistance material layer prepared according to Example 5 of the present invention, one can see the complete lack of pitting. In fact the electrical resistance material layer shows a smooth continuous surface as opposed to the pitted surface shown in FIG. 2. It is believed that this lack of pitting results from the lack of chloride ions in the plating bath. It should be understood then that the present invention contemplates a plating bath lacking in addition to chloride salts, other materials which cause pitting problems.

Second, with reference to Tables 1 and 2, while a bulk analysis by EDX (Energy Dispersive X-Ray) shows the electrical resistance material layers prepared according to Examples 1 and 5 to be basically phosphorous equivalent (13% and 14%P, respectively), analysis of the resistance material layers by XPS (X-ray Photoelectron Spectroscopy) revealed the inclusion of 2.7 atomic percent of sulfur in the resistance material layer prepared according to Example 1 and the total absence of sulfur in the resistance material layer prepared according to Example 5. It is believed that sulfur is deleterious in nickel causing embrittlement, and may be the reason for the increased peel strength of the resistance material layer of the present invention. Thus while the present invention contemplates an electrical resistance material layer having no sulfur within at least the top, e.g., about ten, atomic layers of the electrical resistance material layer, less than about 2% by weight and preferably the total absence of sulfur in the electrical resistance material layer is also within the scope of the present invention.

TABLE 1
EDX Analysis

| Example 1 Reference Bath | Example 5 Bath |
| --- | --- |
| Ni 86.1% | 87.1% |
| P 13.9 | 12.9 |

TABLE 2
XPS Analysis

| Example 1 Reference Bath | Example 5 Bath |
| --- | --- |
| S 2.72 | 0 |

The bath of Example 5 has been operated in the range of $0.25Ni/0.50PO_3$ to $1.25Ni/2.50PO_3$. The phosphorous content of the electrical resistance material layer appears to be a function of the phosphoric acid concentration in the plating bath. See FIG. 4. In the Example 2 bath (no phosphoric acid), the phosphorous content of the electrical resistance material layer was negligible; whereas, in the Example 3 bath, the phosphorous content was about 8.5%. It was found after plating that there was 0.2M/L of hypophosphite in the bath. Thus there appears to be an initial disproportionation of orthophosphite to orthophosphate and hypophosphite with a resulting equilibrium mixture of the various oxidation states in the bath.

While the bath itself represents a significant and unexpected improvement in the state-of-the-art, the unexpected, surprising results found were also those of the physical and electrical characteristics of the electrical resistance material layer. Specifically, the following properties (Table 3) were evaluated from circuit boards produced from the Example 1 reference bath and the Example 5 bath of the present invention, with the conductive and insulating layers being the same. The improved characteristics are the result of the improved quality of the nickel-phosphorous electrical resistance material layer.

TABLE 3

| Example 1 Reference Bath | | Example 5 Bath |
| --- | --- | --- |
| Peel Strength, lbs./inch | 6 | 9 |
| Resistance Change After 1000 Hrs at 70° C., 5 W/in² Load | 3% | 0.2% |
| Temperature Coefficient of Resistance, −65° C. to 125° C. | −50 ppm/°C. | −10 ppm/°C. |

TABLE 3-continued

| Example 1 Reference Bath | | Example 5 Bath |
| --- | --- | --- |
| Current Noise, Microvolt/volt | .05 | <.02 |
| Resistor Value, 10" × 12" Sheet Ohms Per Square | 25.0 ± 1.0 | 25.0 ± 0.25 |

Figure 3:
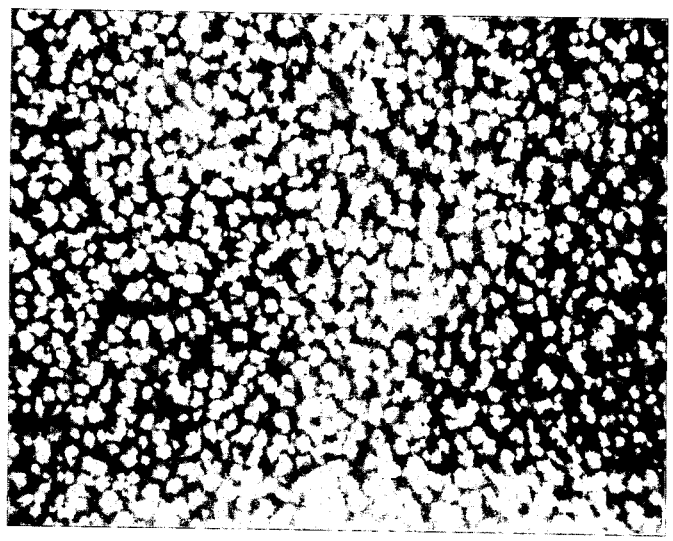
FIG. 3 is a photograph of the surface of an electrical resistance material layer prepared according to the process of the, the present invention.

And, as previously discussed, the photomicrographs shown in FIGS. 2 and 3 (400×, transmitted light, ½ sec. exposure, 4 amps.) clearly show the dramatic improvement of porosity quality resulting from the plating bath of the present invention; the resistance material layer formed from the Reference Bath being relatively more porous; that of the present invention at this magnification being smooth and continuous.

The insulating substrate layer can be a reinforced organic resin, plastic or any of those discussed in U.S. Pat. No. 3,808,576. Moreover it has been found that even more significant improvements in peel strength are observed if a high topographical conducting substrate is used. For example, a high topographical copper foil conductive layer yields a peel strength of about 12.

It should be appreciated to those of skill in the art that the present invention is not limited to the specific examples set forth above, and that many modifications and variations are within the scope of the present invention. In particular, the present invention is intended to cover a transistion metal-phosphorus electrical resistance material layer having up to about 30% by weight phosphorus, with the resistance material layer being sulfur and chloride free, and being relatively non-porous. The bath in general can contain nickel carbonate or its equivalent, phosphorus acid and phosphoric acid, with the amount of phosphorus and phosphoric acid adjustable to vary the amount of phosphorus in the electrical resistance material layer.

We claim:

1. A printed circuit board material in the form of a multilayer stock comprising:
   a support layer;
   at least one layer of electrical resistance material adhering to the support layer; and
   a conductive material layer adhering to the resistance material layer,
   the electrical resistance material layer comprising an electroplated nickel-phosphorous composition wherein at least the top about ten atomic layers of the electrical resistance material layer are free of sulfur.

2. The printed circuit board material of claim 1 wherein the conductive material layer comprises copper foil and the support layer comprises a reinforced organic resin.

3. The printed circuit board material of claim 1 wherein the conductive material layer consists of high topographical copper foil.

4. The printed circuit board material of claim 1 wherein the surface of the electrical resistance layer is substantially pit free and continuous at a magnification of 400×.

5. A composition for an electrical resistance material layer in a multilayered printed circuit board comprising electroplated nickel-phosphorous containing up to about 30 percent by weight of phosphorus and wherein at least the top about ten atomic layers are sulfur free.

6. An electrical resistance material layer according to claim 5 wherein there is present from about 8 to about 30 percent by weight of phosphorus.

7. In a multilayered printed circuit board material having an insulating support layer, an electrical resistance material layer and a conductive material layer, wherein the electrical resistance material layer comprises electroplated nickel-phosphorous containing up to about 30 percent by weight of phosphorus, the improvement wherein the surface of the electrical resistance layer is substantially pit free and continuous at a magnification of 400×.

8. A circuit board material according to claim 7 wherein at least the top about ten atomic layers of the electrical resistance material layer are sulfur free.

9. A circuit board material according to claim 8 wherein the electrical resistance material layer is substantially sulfur free.

10. A circuit board material according to claim 7 wherein the top about ten atomic layers of the electrical resistance material layer contain less than 2% by weight sulfur.

* * * * *